United States Patent
Radus et al.

(10) Patent No.: US 11,487,752 B2
(45) Date of Patent: Nov. 1, 2022

(54) OPTIMIZING OFFLINE MAP DATA UPDATES

(71) Applicant: Apple Inc., Cupertino, CA (US)

(72) Inventors: Alexander Radus, Falkensee (DE); Jonathan P. McCabe, San Jose, CA (US); Joseph A. Dean, Mountain View, CA (US); Matthew B. Ball, Pacifica, CA (US); Sergey Gindin, Berlin (DE); Daniel Eggert, Berlin (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/180,409

(22) Filed: Feb. 19, 2021

(65) Prior Publication Data

US 2021/0173827 A1 Jun. 10, 2021

Related U.S. Application Data

(63) Continuation of application No. 15/879,255, filed on Jan. 24, 2018, now Pat. No. 10,963,450.

(60) Provisional application No. 62/450,216, filed on Jan. 25, 2017.

(51) Int. Cl.
| | | |
|---|---|---|
| *G06F 16/00* | (2019.01) | |
| *G06F 16/23* | (2019.01) | |
| *G06F 16/29* | (2019.01) | |
| *G06F 16/22* | (2019.01) | |
| *H03M 7/30* | (2006.01) | |

(52) U.S. Cl.
CPC ...... *G06F 16/2379* (2019.01); *G06F 16/2246* (2019.01); *G06F 16/29* (2019.01); *H03M 7/30* (2013.01)

(58) Field of Classification Search
CPC .. G06F 16/2246; G06F 16/2379; G06F 16/29; H03M 7/30; H03M 7/3068; H03M 7/3091
USPC ................................................. 707/600–899
See application file for complete search history.

(56) References Cited

U.S. PATENT DOCUMENTS

| | | |
|---|---|---|
| 7,359,956 B2 | 4/2008 | Kanai et al. |
| 8,836,548 B1 | 9/2014 | Chandra |
| 9,881,389 B1 | 1/2018 | Higgs et al. |
| 10,127,324 B2 | 11/2018 | Ding et al. |
| 10,199,199 B2 | 2/2019 | Hara et al. |
| 2005/0177825 A1* | 8/2005 | Kamalanathan .......... G06F 8/65 717/120 |
| 2005/0203892 A1* | 9/2005 | Wesley ................ G06F 16/258 |
| 2008/0134165 A1* | 6/2008 | Anderson .......... H04N 21/4586 717/173 |
| 2008/0147319 A1* | 6/2008 | Cubillo ................. G01C 21/32 701/431 |

(Continued)

*Primary Examiner* — Michelle N Owyang
(74) *Attorney, Agent, or Firm* — Invoke

(57) ABSTRACT

In some implementations, a system can optimize offline map data updates. For example, a server device in the system can determine a metric for identifying map data objects based on attributes of the map data objects. The server device can then generate a quadtree that stores the map data objects in nodes of the quadtree based on the metric. When processing an update to the map data stored at the server device, the server device can generate update data describing the updates for each node in the quadtree based on a binary difference algorithm and/or a semantic difference algorithm. The server device can select the algorithm based on which algorithm results in the smallest compressed size of the update data.

20 Claims, 8 Drawing Sheets

(56) References Cited

U.S. PATENT DOCUMENTS

| | | | |
|---|---|---|---|
| 2009/0015672 A1* | 1/2009 | Clapp | G06F 16/78 348/143 |
| 2010/0318759 A1 | 12/2010 | Hamilton et al. | |
| 2011/0055355 A1* | 3/2011 | Lee | H04L 67/34 709/219 |
| 2011/0130951 A1* | 6/2011 | Lee | G01C 21/32 709/219 |
| 2011/0173601 A1 | 7/2011 | De Los Reyes | |
| 2013/0035853 A1 | 2/2013 | Stout et al. | |
| 2013/0088492 A1 | 4/2013 | Jagadev et al. | |
| 2013/0328862 A1 | 12/2013 | Piemonte | |
| 2015/0370828 A1 | 12/2015 | Maurer et al. | |
| 2017/0336216 A1 | 11/2017 | Tanizaki | |

* cited by examiner

OPTIMIZING OFFLINE MAP DATA UPDATES

INCORPORATION BY REFERENCE; DISCLAIMER

Each of the following applications are hereby incorporated by reference: application Ser. No. 15/879,255, filed on Jan. 24, 2018; application No. 62/450,216, filed Jan. 25, 2017. The Applicant hereby rescinds any disclaimer of claim scope in the parent application(s) or the prosecution history thereof and advises the USPTO that the claims in this application may be broader than any claim in the parent application(s).

TECHNICAL FIELD

The disclosure generally relates to performing data updates between devices.

BACKGROUND

Mobile devices, such as smartphones, tablet computers, smart watches, and other computing devices, often include applications that provide interfaces that allow users to utilize services from network service providers. An example of such applications and/or services is map and/or navigation related applications and/or services. For example, while a user is using a map application on a mobile device, the map application can use a network (e.g., Internet connection) to obtain map data (e.g., map images, points of interest, etc.) for the mobile device's current location from a map service over the network connection. The map application can then provide various map related services to the user using the map data received from the map service. To enable the user to continue using the maps service while the mobile device is offline (e.g., not connected to the network), the map application on the mobile device can download map data and store the map data on the mobile device so that the map data can be used when the mobile device is offline (e.g., not connected to the network). However, keeping the offline map data stored on the mobile device up to date can be expensive in terms of data storage on the mobile device, network bandwidth usage, processing cycles, and/or time needed to make the updates.

SUMMARY

In some implementations, a system can optimize offline map data updates. For example, a server device in the system can determine a metric for identifying map data objects based on attributes of the map data objects. The server device can then generate a quadtree that stores the map data objects in nodes of the quadtree based on the metric. When processing an update to the map data stored at the server device, the server device can generate update data describing the updates for each node in the quadtree based on a binary difference algorithm and/or a semantic difference algorithm. The server device can select the algorithm based on which algorithm results in the smallest compressed size of the update data.

In some implementations, a client device of the system can request map data updates by providing map data object identifiers corresponding to the map objects stored on the client device. The server device can determine which map data objects the client device should update based on the map data object identifiers received in the map data update and send a map data object update manifest, including the identifiers for the determined map data objects, to the client device. The client device can then download the map data update objects identified in the map data object update manifest.

Particular implementations provide at least the following advantages. The data update mechanisms described herein provide for both efficient compression of data as well as efficient data updates.

Details of one or more implementations are set forth in the accompanying drawings and the description below. Other features, aspects, and potential advantages will be apparent from the description and drawings, and from the claims.

DESCRIPTION OF DRAWINGS

Like reference symbols in the various drawings indicate like elements.

DETAILED DESCRIPTION

Overview

Figure 1:
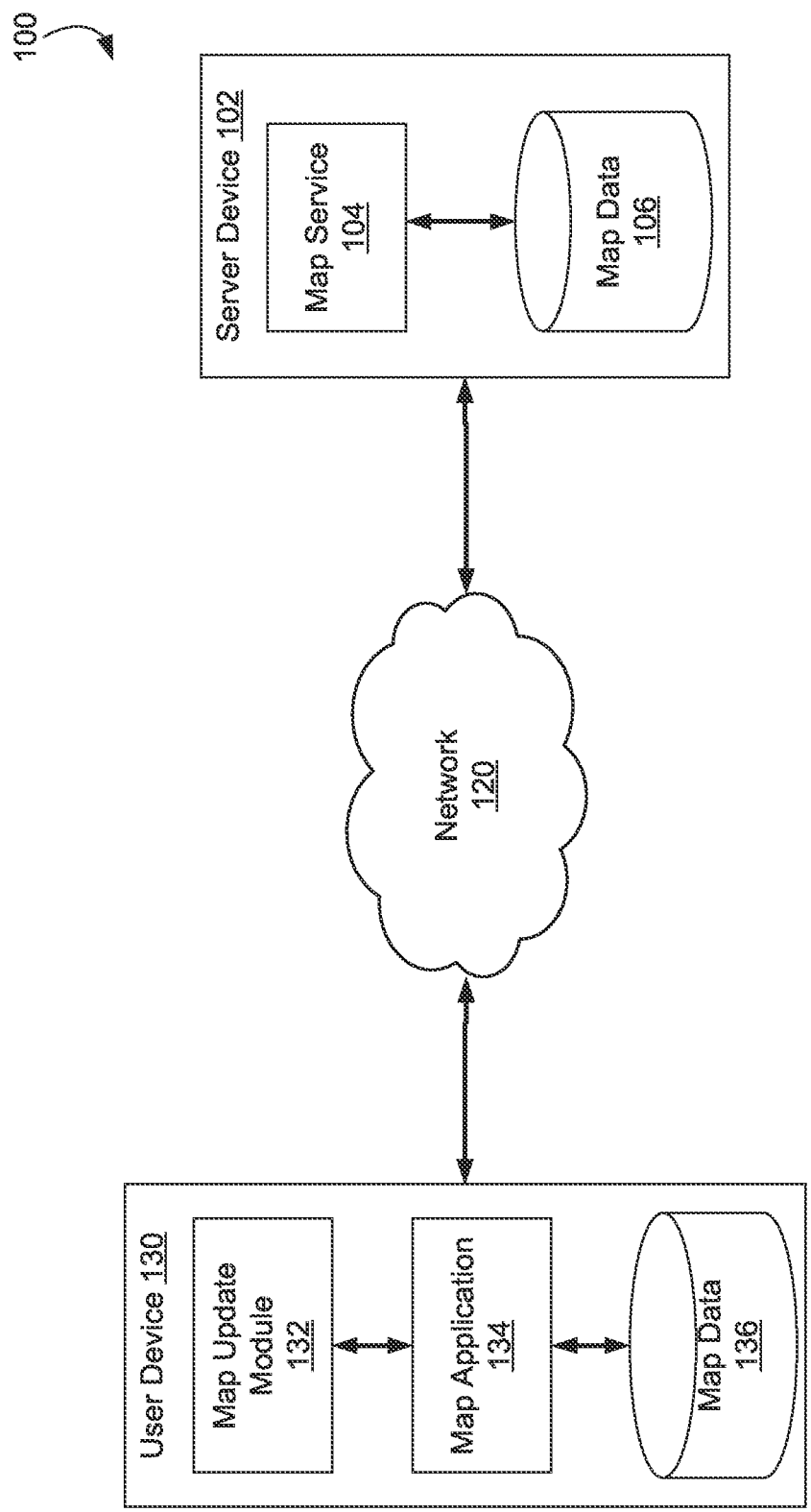
FIG. 1 is a block diagram of an example system for optimizing offline map data updates.

FIG. 1 is a block diagram of an example system 100 for optimizing offline map data updates. For example, system 100 can be configured to optimize offline map data updates to find a balance between efficient compression of the offline map data and efficient map data update data size. Thus, system 100 can be configured to separate map data into compartments that are large enough for meaningful compression while being small enough for resource efficient data updates.

In some implementations, system 100 can include server device 102. For example, server device 102 can represent a computing device or multiple computing devices associated with a map (e.g., navigation) services provider. Server device 102 can correspond to well-known server hardware architectures and include processors for performing operations for providing map services, such as the offline map data updates described herein.

In some implementations, server device 102 can include map service 104. For example, map service 104 can be a software server that provides backend processing for a map service provider. Map service 104 can, for example, obtain map data (e.g., map images, points of interest, navigation and/or routing information, etc.) from map data database 106 and send the map data to various client devices (e.g., user device 130) so that the client devices can present maps and/or navigation information to the users of the client devices. For example, map service 104 can send map data to a client device while the client device is connected to server device 102 through network 120 (e.g., the Internet). The client device can present the map data to the user using a map or navigation application on the client device.

In some implementations, map service 104 can provide offline map data to the client devices. For example, server device 102 can organize the map data in map data database 106 so that the map data can be stored and/or updated more efficiently on a client device and/or on server device 102.

In some implementations, map service 104 can organize map data in map data database 106 into a quadtree structure. For example, the map data in map data database 106 can include different map data categories. For example, a category can correspond to data for calculating routes. A category can correspond to road networks. A category can correspond to points of interest. A category can correspond to any other logically related grouping of map data. Map service 104 can generate a different quadtree structure for each category of map data stored in map data database 106.

Figure 2:
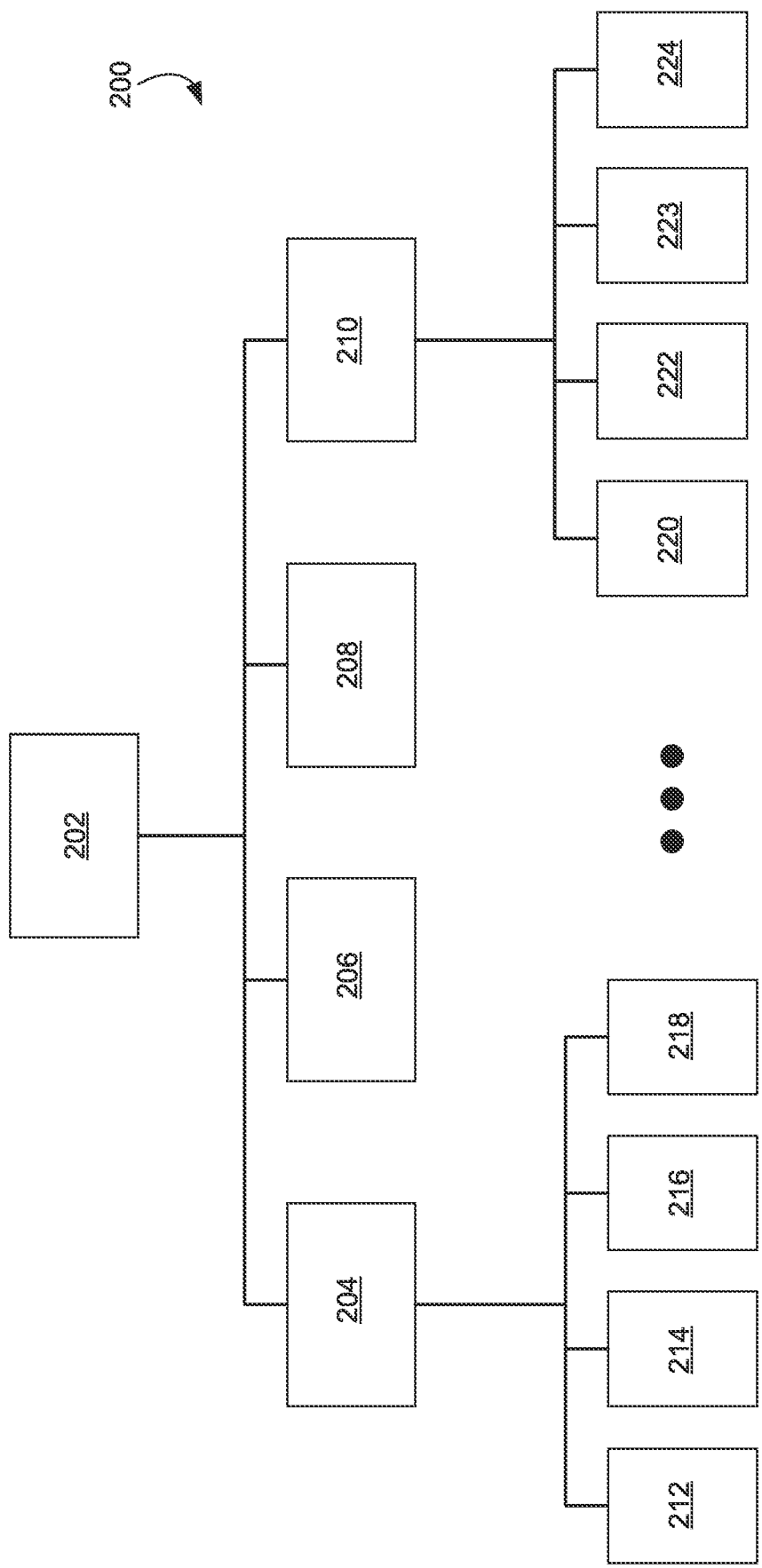
FIG. 2 illustrates an example quadtree structure for organizing map data.

FIG. 2 illustrates an example quadtree structure 200 for organizing map data. To generate quadtree structure 200, map service 104 can determine a metric for organizing the map data objects within the map data for a category. For example, the map data in map data database 106 can include many different map data objects for each map data category. When map service 104 is building a quadtree for the points of interest map data category, map service 104 can generate a metric for each point of interest map data object within the points of interest category. For example, if a point of interest object corresponds to the Golden Gate Bridge in San Francisco, then the point of interest object can include attributes that describe the name of the point of interest, the location of the point of interest, and a reference to any related point of interest objects, or other map data objects. Map service 104 can use the attributes of the point of interest object to generate a metric or identifier for the point of interest object. For example, map service 104 can use the location of the point of interest object to generate a metric that uniquely identifies the point of interest object and that inherently provides an order for the point of interest object relative to other point of interest objects.

In some implementations, map service 104 can generate quadtree structure 200 using the generated metric (e.g., globally unique identifier—GUID) for each map data object. For example, map service 104 can generate the quadtree such that each leaf node 212-224 in quadtree 200 corresponds to a geographical area that has the same size as other leaf nodes in the quadtree, while nodes at each level of the quadtree correspond to geographical areas of different sizes. For example, the geographical area corresponding to a parent node can be divided among children nodes at different levels until leaf nodes of a certain size (e.g., geographical size, data size, etc.) are obtained. For example, the root node 202 (level 1) of a quadtree stored at server device 102 may correspond to the earth. Level 2 of the quadtree may include four nodes 204, 206, 208, 210 each corresponding one quarter of the earth, and so on until leaf nodes 212-224 covering some relatively small geographical area are generated.

Moreover, map data can be distributed across each node in the quadtree (e.g., across and/or up and down) so that each node in the quadtree stores the same amount of data. When assigning data to nodes in the quadtree, map service 104 can use the generated metric to distribute the map data objects to the nodes of the quadtree in an ordered manner. For example, each branch and/or node in the quadtree can cover a range of identifiers (metrics) for map data objects. Map data objects can be routed to a node in the quadtree based on the identifier for the map data object and the range covered by each branch/node. If a map data object cannot fit (e.g., either geographically or data size) within a single leaf node, the map data object can be stored in a parent node that can accommodate the size of the map data object.

Figure 3:
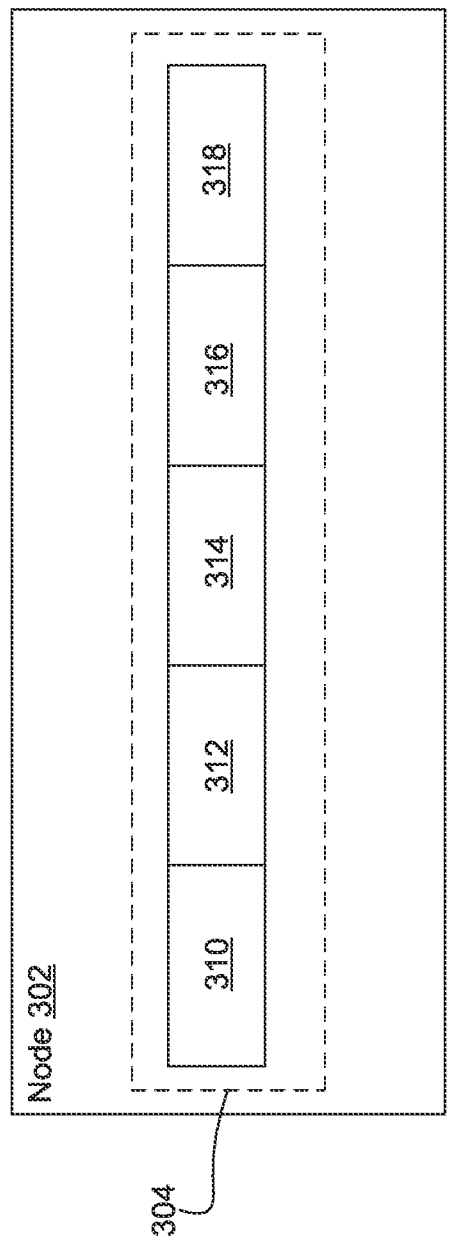
FIG. 3 illustrates an example node storing a map data object collection.

FIG. 3 illustrates an example node 300 storing a map data object collection. For example, node 300 can correspond to any of the nodes 202-224 of FIG. 2. In some implementations, each node in the quadtree can include a collection of map data objects. For example, after map service 104 determines a node 300 for storing the map data object based on the GUID for the map data object, map service 104 can store the map data object in a map data object collection 304 within node 300. For example, the map data object collection for a particular node in the points of interest quadtree can include all points of interest associated with the geographical area represented by the node. If the data in the map data collection 304 of node 300 becomes too large, node 300 can be split or new nodes can be added and the map data objects within map data collection 304 can be distributed across the new nodes. The map data objects 310, 312, 314, 316 and/or 318 within a collection can be ordered by their respective map data object identifiers (e.g., GUID, metric, etc.). Thus, the organization of the quadtree and the mechanism for assigning map data objects to nodes and collections within the quadtree provides for a deterministic (e.g., predictable, consistent, etc.) approach to quadtree generation for map data objects.

Referring back to FIG. 1, system 100 can include user device 130. For example, user device 130 can be a mobile device, such as a smartphone, tablet computer, smartphone or other computing device.

In some implementations user device 130 can include map application 134. For example, map application 134 can be a client application of map service 104. Map application 104 can request map data from map service 104 and map service 104 can send the map data to map application 134 through network 120. When requesting map data from map service 104, map application 134 can specify the size of the display of user device 130 and the location of user device 130. Map service 104 can use the location data and the display size to determine a node at the appropriate level of quadtree 200 for providing map data objects. For example, if the display size of user device 130 is appropriate for presenting a one square mile area, then map service 104 will determine node in quadtree 200 that corresponds to the current location of user device 130 and that represents a one square mile area. Map service 104 can use the determined node as the root node for the quadtree structure, and corresponding map data objects, sent to user device 130. Stated differently, map service 104 can send the determined node and all child nodes (descendants) of the determined node to user device 130. In some implementations, map service 104 can use a node one or two levels higher in the quadtree as the root node for the quadtree (e.g., subtree) sent to user device 130.

In some implementations, user device 130 can store map data in map data database 136. For example, when user device 130 receives the quadtree (e.g., subtree of quadtree 200) from map service 104, map application 134 can store the quad tree in map data database 136. Map application 134 can then use the map data stored in map data database 136 to provide map related services while user device 130 is offline (e.g., not connected to network 120 and/or server device 102).

In some implementations, map application 134 can request a map data update from map service 104. For example, in response to detecting a network connection or in response to detecting a specific type of network connection (e.g., a Wi-Fi network connection), map application 134 can send a map data update request to map service 104. In some implementations, map application 134 can request an update after a period of time has passed. For example, map application 134 can request map updates on a periodic interval or after an amount of time has passed since the previous update.

In some implementations, map application 134 can send a map data update request that includes identifiers for each map data object stored on user device 130. For example, map application 134 can traverse the quadtree structure stored in map data database 136 and obtain identifiers for each map data object stored in the quadtree. Map application can then send the identifiers to map service 104 in the map data update request.

In some implementations, map service 104 can determine which map data objects identified in the map data request have updates available. As described above, map data database 106 can store map data. Over time, map service 104 can receive updates to the map data. For example, an employee of the map service provider can create a new updated version of the map data or a map data vendor can provide a new updated version of the map data to map service 104. When map service 104 receives a map data update, map service 104 can compare the new version of the map data to the old version of the map data to generate map update data that describes the differences between the nodes and/or map data objects contained in the old version of the map data (e.g., the quadtree corresponding to the old map data) and the nodes and/or map data objects contained in the new version of the map data (e.g., the quadtree corresponding to the new map data). When a difference exists between an old version of a node or map data object and a new version of a corresponding node or map data object, map service 104 can store data identifying the node and/or map data object as an updated node or object. Thus, when map application 134 requests an update, map service 104 can compare the map object identifiers and/or node identifiers in the request to the data identifying updated nodes and/or objects to quickly identify nodes and/or objects in the map data update request that have been updated. Map service 104 can then send the list of updated objects and/or nodes to map application 134.

In some implementations, map service 104 can calculate the difference between corresponding new and old nodes and objects using a binary difference algorithm. For example, map service 104 can calculate the difference between new and old nodes and map data objects using the well-known binary difference algorithm. The algorithm takes as input corresponding old and new data and produces a description of the changes (e.g., a diff, patch, etc.) that can be used to create the new version of the object or node from an older (e.g., previous) version of the object or node. Map service 104 can store the description of the changes for the node and/or map data object for later delivery to a client requesting a map data update, as described further below.

In some implementations, map service 104 can calculate the difference between corresponding new and old nodes and objects using a semantic difference algorithm. For example, the semantic difference algorithm can compare the attributes (e.g., variables, values, etc.) of the old nodes and/or map data objects to the attributes of the new nodes and/or map data objects. Thus, the semantic difference algorithm will compare name attributes, location attributes, reference attributes, etc., between the old and the new nodes and/or map data objects and generate a description of the changes between the old nodes and/or map data objects and the corresponding new nodes and/or map data object. For example, the semantic difference algorithm can not only determine changes to attributes in map data objects, but can also detect movement of map data objects within collections inside nodes. The differences can be described as changes at the node level (e.g., object additions, deletions, moves within collection) and as changes at the map data object level (e.g., changes to object attributes). Map service 104 can store the description of the changes for the node and/or map data object for later delivery to a client requesting a map data update, as described further below.

In some implementations, map service 104 can calculate the difference between corresponding new and old nodes and objects using both the binary difference algorithm and the semantic difference algorithm. For example, to ensure that map data service 104 is using the difference algorithm that produces the best compression for the corresponding map data, map service 104 can calculate the difference between corresponding new and old nodes and objects using both the binary difference algorithm and the semantic difference algorithm and then compress the output of each difference algorithm (e.g., the description of the changes, diff, patch, etc.). Map service 104 can then select the difference output that compresses to the smallest size to send to the client devices (e.g., user device 130) when performing an update on the client device.

In some implementations, map data objects can include references to other objects. For example, two different map data objects may be related and reference each other. In some implementations, the references can include relative paths between map data objects. For example, a relative reference can describe one object's position in the quadtree relative to another object. An example of this could be that the relative reference indicates that the related node is one node up the tree, two nodes to the right, and one node down the tree. When an object moves within the tree or within a node collection, instead of updating the relative reference inside the map data object, map service 104 (or map application 134) can use the difference information describing an object's movement to determine the new position of the moved object in real time.

In some implementations, map application 134 can receive an update manifest from map service 104. For example, the update manifest can include identifiers for each map data object and/or node in the client's quadtree (e.g., stored in map data database 136) that has an update available. The update manifest may include the same map data object identifiers as the map data update request that map application 134 sent to map service 104. The update manifest may include additional or different map data object identifiers. For example, if a node has been split into multiple different nodes or if a map data object has moved from one node to another node, the update manifest can identify additional nodes and/or map data objects that map application 134 should update.

After receiving the update manifest, map application 134 can download the map data updates for each map data object and/or node identified in the update manifest. For example, the map data updates downloaded by map application 134 can correspond to the compressed difference algorithm output, as described above. The compressed difference algorithm output can correspond to the binary difference algorithm or the semantic difference algorithm based on which algorithm produces the smallest compressed data size, as described above.

After downloading the map data updates, map application 134 can send the map data updates and the corresponding map data objects and/or nodes to map update module 132. For example, map update module 132 can apply the map data updates to the corresponding nodes and/or map data objects to generate the latest version of the nodes and/or map data objects. After the map data objects and/or nodes are updated, map update module 132 can send the updated map data objects and/or nodes to map application 134 and map application 134 can store the updated nodes and/or map data objects in map data database 136. Map application 134 can then provide map related services to the user using the updated map data in map data database 136 when user device 130 is offline.

In some implementations, map application 134 can perform incremental updates of map data. For example, rather than applying map data updates all at once, map application 134 can update a category of map data at a time. For example, it may be time consuming to update all of the map data stored on user device 130. Thus, map application 134 may opportunistically update categories of map data (e.g., map images, points of interest, routing data, road networks, etc.) individually. Thus, map application 134 may provide an updated map image while providing an older version of routing data to the user. Map application 134 can then later update the road networks and routing data before updating the points of interest. Thus, map application 134 may present a hybrid of old and new map data to the user until map application 134 has the opportunity and/or resources (e.g., network bandwidth, network connection type, sufficient battery power, external power, data storage capacity, etc.) available to complete the map data update.

Example Processes

Each of the processes described below describe specific steps performed in a specific order. However, a skilled person will easily recognize that these processes can be performed with a greater or lesser number of steps. A skilled person would also recognize that some of the steps of these methods can be rearranged and/or performed in a different order while still producing the same or similar results. Moreover, one or more of these methods and/or method steps may be combined with other methods to perform the operations and/or provide the features described herein.

Figure 4:
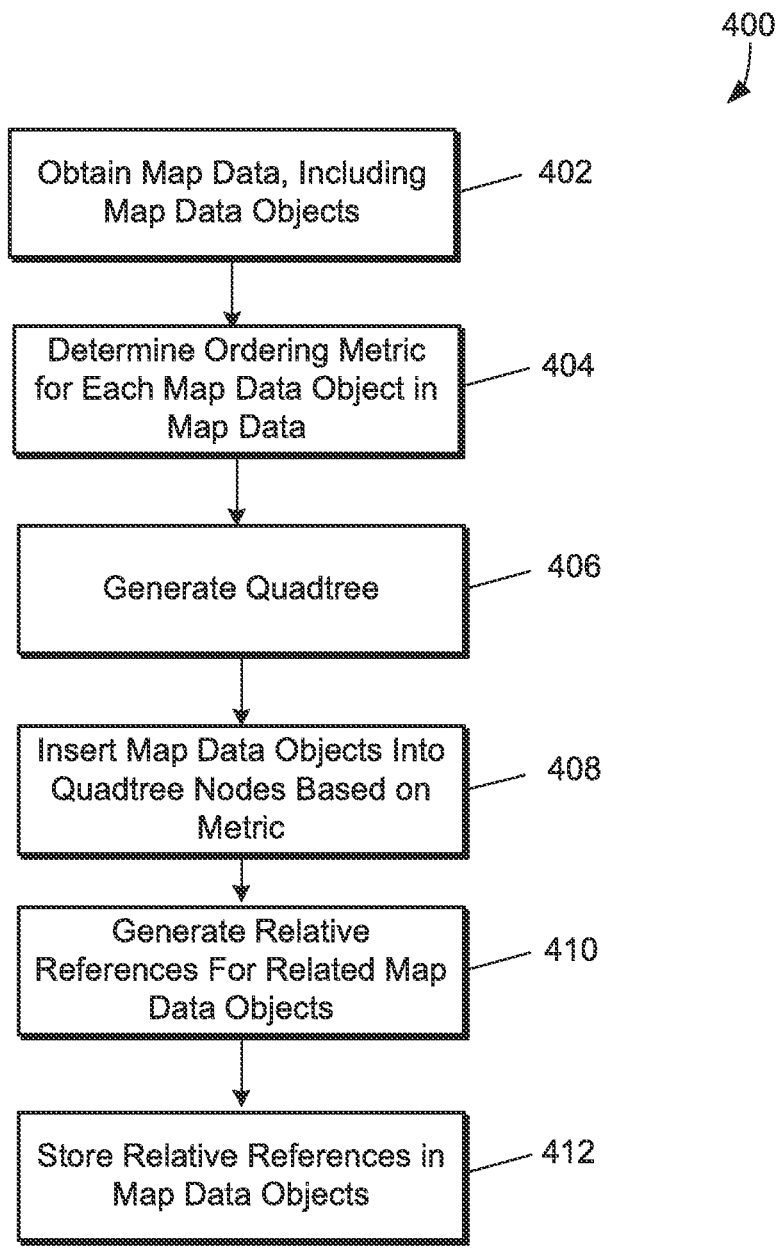
FIG. 4 is flow diagram of an example process for generating a quadtree for map data.

FIG. 4 is flow diagram of an example process 400 for generating a quadtree for map data. For example, process 400 can be performed by a map service running on a server device.

At step 402, a server device can obtain map data, including map data objects. For example, the server device can obtain the map data through user input (e.g., an employee of the map service provider entering map data into the system). The server device can obtain map data from a map data vendor (e.g., through a network connection).

At step 404, the server device can determine an ordering metric for each map data object in the map data. For example, the ordering metric can be used as an identifier for each map data object. The ordering metric for a map data object can be generated based on one or more attributes of the map data object, such as geographic location, so that the metric produces a natural order among map data objects.

At step 406, the server device can generate a quadtree. For example, the server device can generate the quadtree starting with the root node (e.g., corresponding to the largest map data area, e.g., the Earth). The server device can add nodes to the quadtree as map data objects are added to the quadtree to maintain an equal distribution of data that is also less than some node data limit amongst the nodes within the quadtree.

At step 408, the server device can insert map data objects into the quadtree nodes based on the metric for each map data object. For example, the map data objects can be muted onto different branches of the quadtree and into different nodes based on the metric or identifier associated with each map data object. When a node reaches data capacity (e.g., above the node data size threshold), the child nodes can be added to the node and the node's map data objects can be distributed among the child nodes based on the metric associated with each node.

At step 410, the server device can generate relative references for related map data objects. For example, the server device can define references between different map data objects by defining a relative path from one map data object to the related map data object. The server device can then store the relative reference (e.g., quadtree path) in the map data object at step 412.

Figure 5:
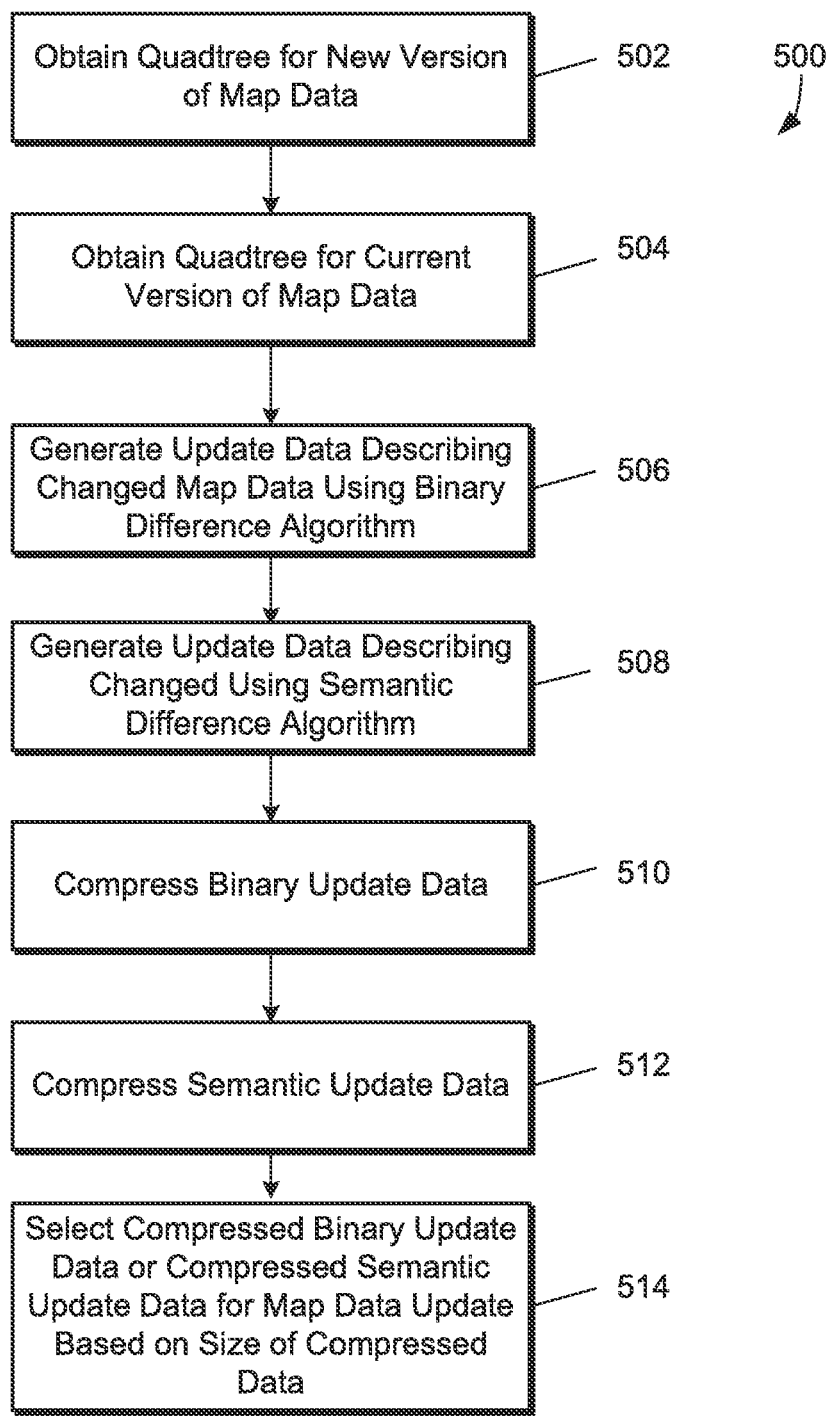
FIG. 5 is a flow diagram of an example process for generating compressed difference data using a hybrid approach.

FIG. 5 is a flow diagram of an example process 500 for generating compressed difference data using a hybrid approach. For example, process 500 can be performed by a map service running on a server device. Process 500 can be performed to calculate the difference between a current version of map data and a new version of map data. Process 500 can be performed in response to receiving new map data at the map service. Process 500 can be performed in response to receiving a map data update request from a map application on a client device.

At step 502, a server device can obtain a quadtree for a new version of map data. For example, when the server device obtains a new version of map data, the server device can generate a new quadtree for the new map data and store the new quadtree in a map data database. When comparing the new version of the quadtree with an old version of the quadtree, the server device can obtain the new version of the quadtree from the map data database.

At step 504, the server device can obtain a quadtree for the current version of the map data. As described above, the server device can obtain the current version (e.g., old version) of the map data quadtree from the map data database. When comparing the new version of the quadtree with an old version of the quadtree, the server device can obtain the old or current version of the quadtree from the map data database.

At step 506, the server device can generate update data for map data in the quadtree using a binary difference algorithm. For example, the server device can calculate the differences (e.g., a difference description, diff, patch, etc.) between old map data objects and new map data objects using the binary difference algorithm. The difference calculation can be performed for each map data object, rather than the map data as a whole, so that incremental or partial updates of data can be performed at the map data object level.

At step 508, the server device can generate update data for map data in the quad tree using a semantic difference algorithm. For example, the server device can calculate the differences (e.g., a difference description, diff, patch, etc.) between old map data objects and new map data objects using the semantic difference algorithm described above. The difference calculation can be performed for each map data object, rather than the map data as a whole, so that incremental or partial updates of data can be performed at the map data object level.

At step 510, the server device can compress the binary update data. For example, the server device can compress the binary update data generated at step 506 using a well-known compression algorithm.

At step 512, the server device can compress the semantic update data. For example, the server device can compress the semantic update data generated at step 508 using a well-known compression algorithm.

At step 514, the server device can select the binary update data or semantic update data to distribute to clients in a map data update based on the size of the compressed data. For example, when the size of the compressed binary difference data is smaller than the size of the compressed semantic difference data, the server can select to distribute the compressed binary difference data to map service clients in the map data update. When the size of the compressed semantic difference data is smaller than the size of the compressed binary difference data, the server can select to distribute the compressed semantic difference data to map service clients in the map data update.

Figure 6:
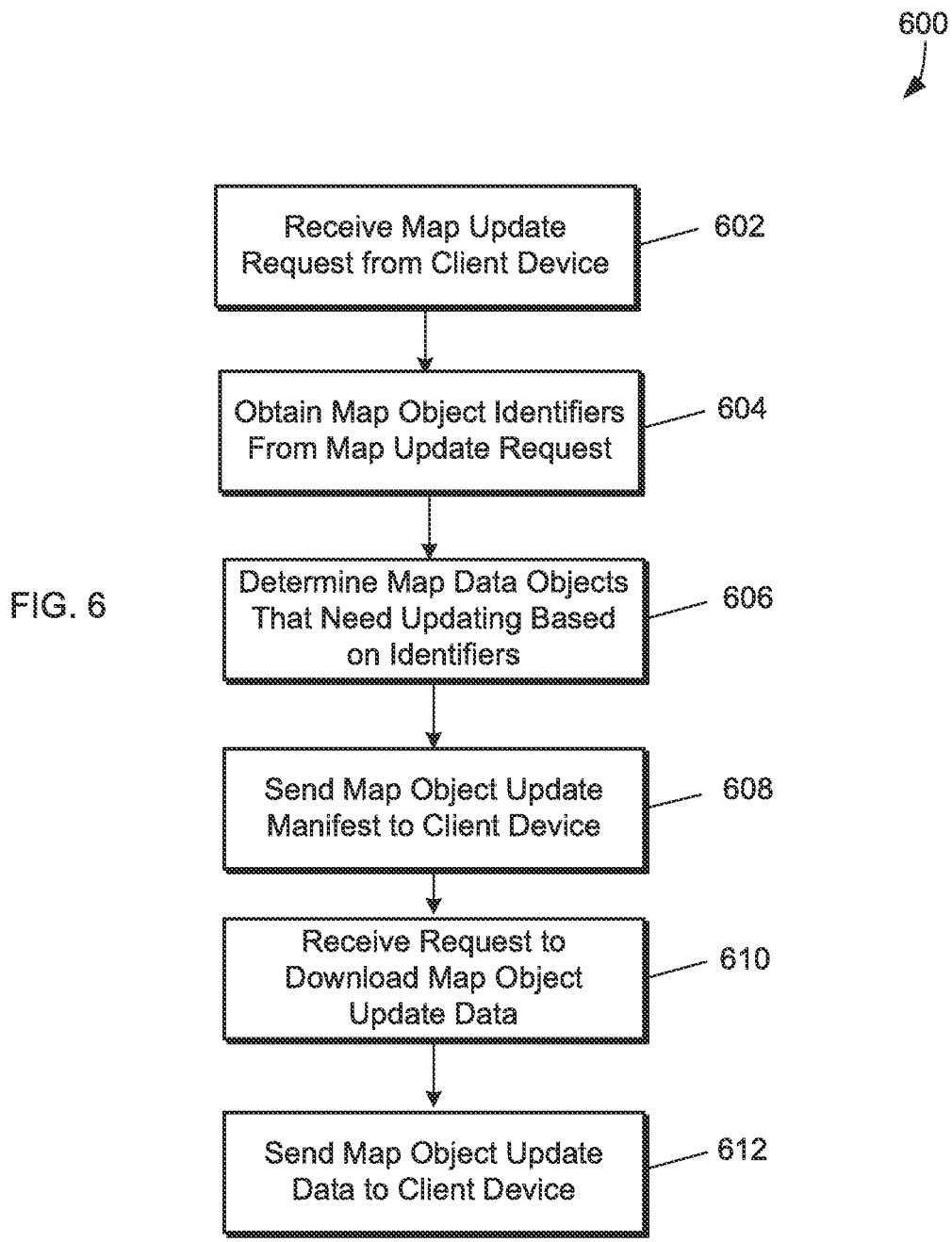
FIG. 6 is a flow diagram of an example process for processing a map data update request.

FIG. 6 is a flow diagram of an example process 600 for processing a map data update request. For example, process 600 can be performed by a map service running on a server device to provide map data updates to a client device in response to a map update request.

At step 602, a server device can receive a map update request from a client device. For example, the server device can receive a map update request from a map application running on the client device.

At step 604, the server device can obtain map object identifiers from the map update request. For example, the map update request can identify map data objects and/or quadtree nodes that are currently stored on the client device.

At step 606, the server device can determine map data objects that need updating based on the map data object identifiers. For example, the server device can determine whether the server has previously stored difference descriptions for the map data objects corresponding to the map data object identifiers. When the server device determines that a difference description exists for an identified map data object, the server can determine that an update exists for the identified map data object. The server device can then add the identifier for the map data object to a map object update manifest that identifies map data objects that have a corresponding update available.

At step 608, the server device can send the map object update manifest to the client device. For example, the server device can send the map object update manifest to the map application on the client device so that the map application can download and update the map data objects opportunistically (e.g., when computing resources and contexts allow).

At step 610, the server device can receive a request to download map data object update data. For example, the server device can receive a request from a client device identifying a map data object update data to send to the client device. The server device can obtain the compressed update data (e.g., diff data, patch data, etc.) describing the changes to the identified map data object. The compressed update data can correspond to the update data selected at step 514 of process 500.

At step 612, the server device can send the map object update data to the client device. For example, the server device can send the update data (e.g., diff data, patch data, etc.) describing the changes to the identified map data object to the client device. When updates are requested for multiple map data objects, the server device can aggregate the compressed update data and send the aggregated, compressed update data to the client device.

Figure 7:
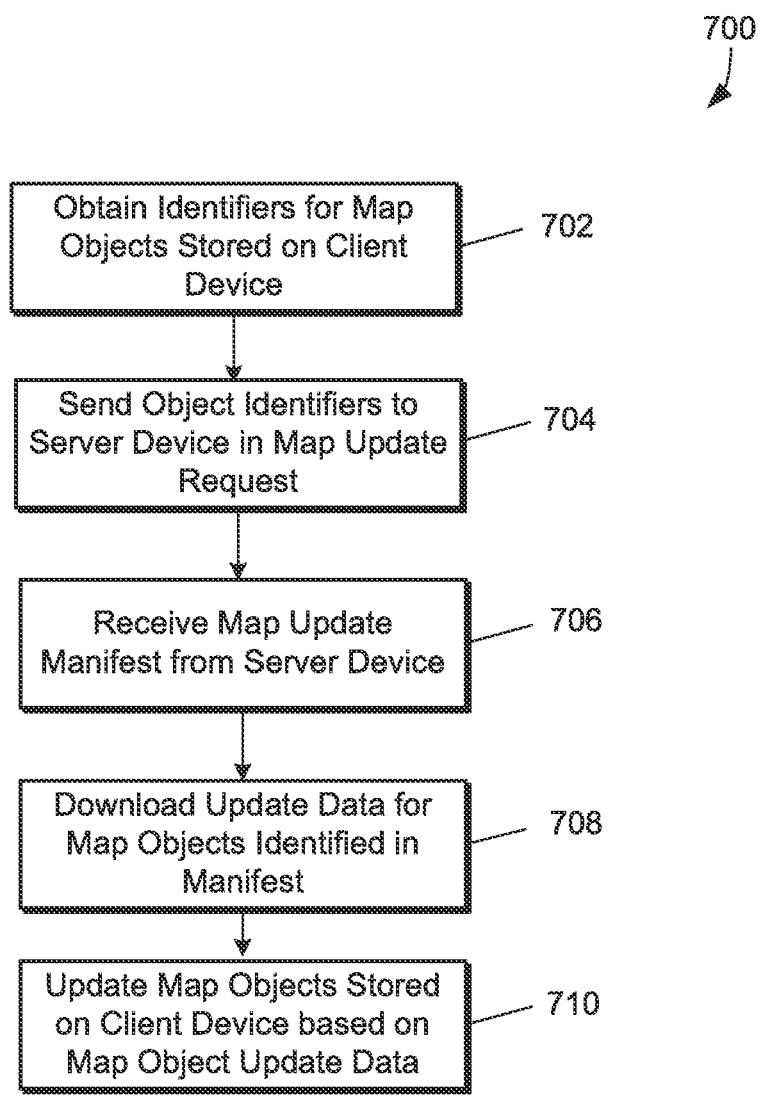
FIG. 7 is a flow diagram of an example process for updating map data on a client device.

FIG. 7 is a flow diagram of an example process 700 for updating map data on a client device. For example, process 700 can be performed by a map application running on a user device.

At step 702, a client device can obtain identifiers for map objects stored on the client device. For example, the client device can traverse a locally stored quadtree and obtain identifiers for each node and/or map data object in the quadtree.

At step 704, the client device can send the identifiers to a server device in a map update request. For example, the client device can send the identifiers to a map service running on the server device.

At step 706, the client device can receive a map update manifest from the server device. For example, a map application on the client device can receive the map update manifest that identifies additional and/or updated map data objects and/or nodes that the map application should download to update the map data stored in the local quadtree.

At step 708, the client device can download update data for map objects identified in the manifest. For example, the client device can initiate downloads of map update data for map data objects and/or quadtree nodes identified in the manifest opportunistically. For example, the client device can initiate downloads of the map update data when connected to Wi-Fi, connected to an external power source (e.g., rather than the internal battery), and/or when the user is not using the client device. Other device contexts might allow the client device an opportunity to download update data for map objects as well.

At step 710, the client device can update map objects stored on the client device based on map object update data. For example, for each map data object and/or node that is identified in the manifest, the map application on the client device can send the identified node and/or map data object along with the update description (e.g., diff, patch, etc.) to a map update module (e.g., operating system utility, function, etc.). The map update module can apply the changes described in the update description to the corresponding, identified node and/or map data object to generate the current, latest version of the map data object and/or node. The map update module can then return the map data object and/or node to the map application and the map application can store the updated map data object and/or node in the local map data quadtree.

Graphical User Interfaces

This disclosure above describes various Graphical User Interfaces (GUIs) for implementing various features, processes or workflows. These GUIs can be presented on a variety of electronic devices including but not limited to laptop computers, desktop computers, computer terminals, television systems, tablet computers, e-book readers and smart phones. One or more of these electronic devices can include a touch-sensitive surface. The touch-sensitive surface can process multiple simultaneous points of input, including processing data related to the pressure, degree or position of each point of input. Such processing can facilitate gestures with multiple fingers, including pinching and swiping.

When the disclosure refers to "select" or "selecting" user interface elements in a GUI, these terms are understood to include clicking or "hovering" with a mouse or other input device over a user interface element, or touching, tapping or gesturing with one or more fingers or stylus on a user interface element. User interface elements can be virtual buttons, menus, selectors, switches, sliders, scrubbers, knobs, thumbnails, links, icons, radio buttons, checkboxes and any other mechanism for receiving input form, or providing feedback to a user.

Privacy

The present disclosure recognizes that the use of such personal information data, in the present technology, can be used to the benefit of users. For example, the personal information data can be used to deliver targeted content that is of greater interest to the user. Accordingly, use of such personal information data enables calculated control of the delivered content. Further, other uses for personal information data that benefit the user are also contemplated by the present disclosure.

The present disclosure further contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. For example, personal information from users should be collected for legitimate and reasonable uses of the entity and not shared or sold outside of those legitimate uses. Further, such collection should occur only after receiving the informed consent of the users. Additionally, such entities would take any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of advertisement delivery services, the present technology can be configured to allow users to select to "opt in" or "opt out" of participation in the collection of personal information data during registration for services. In another example, users can select not to provide location information for targeted content delivery services. In yet another example, users can select to not provide precise location information, but permit the transfer of location zone information.

Example System Architecture

Figure 8:
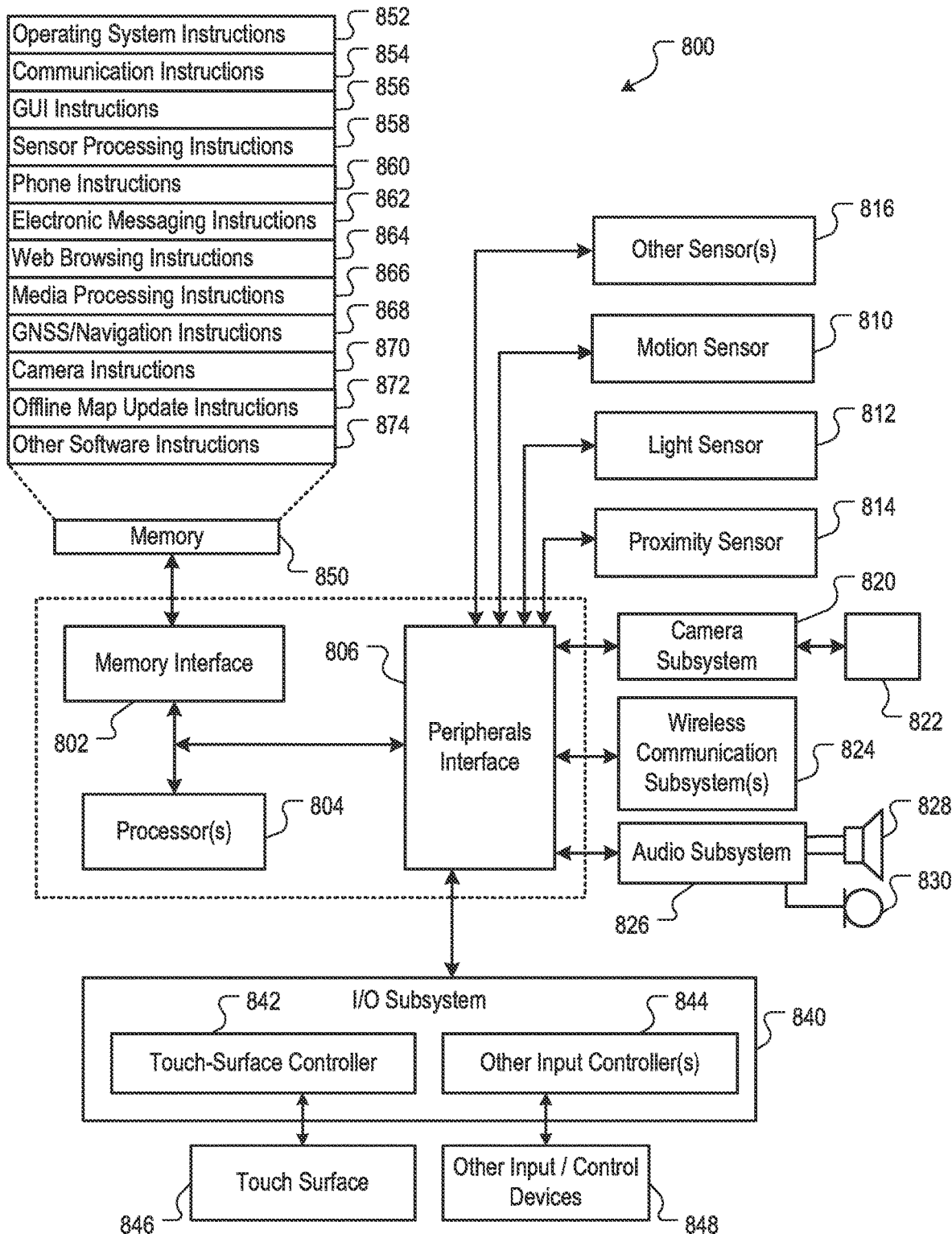
FIG. 8 is a block diagram of an exemplary system architecture implementing the features and processes of FIGS. 1-7.

FIG. 8 is a block diagram of an example computing device 800 that can implement the features and processes of FIGS. 1-7. The computing device 800 can include a memory interface 802, one or more data processors, image processors and/or central processing units 804, and a peripherals interface 806. The memory interface 802, the one or more processors 804 and/or the peripherals interface 806 can be separate components or can be integrated in one or more integrated circuits. The various components in the computing device 800 can be coupled by one or more communication buses or signal lines.

Sensors, devices, and subsystems can be coupled to the peripherals interface 806 to facilitate multiple functionalities. For example, a motion sensor 810, a light sensor 812, and a proximity sensor 814 can be coupled to the peripherals interface 806 to facilitate orientation, lighting, and proximity functions. Other sensors 816 can also be connected to the peripherals interface 806, such as a global navigation satellite system (GNSS) (e.g., GPS receiver), a temperature sensor, a biometric sensor, magnetometer or other sensing device, to facilitate related functionalities.

A camera subsystem 820 and an optical sensor 822. e.g., a charged coupled device (CCD) or a complementary metal-oxide semiconductor (CMOS) optical sensor, can be utilized to facilitate camera functions, such as recording photographs and video clips. The camera subsystem 820 and the optical sensor 822 can be used to collect images of a user to be used during authentication of a user, e.g., by performing facial recognition analysis.

Communication functions can be facilitated through one or more wireless communication subsystems 824, which can include radio frequency receivers and transmitters and/or optical (e.g., infrared) receivers and transmitters. The specific design and implementation of the communication subsystem 824 can depend on the communication network(s) over which the computing device 800 is intended to operate. For example, the computing device 800 can include communication subsystems 824 designed to operate over a GSM network, a GPRS network, an EDGE network, a Wi-Fi or WiMax network, and a Bluetooth™ network. In particular, the wireless communication subsystems 824 can include hosting protocols such that the device 100 can be configured as a base station for other wireless devices.

An audio subsystem 826 can be coupled to a speaker 828 and a microphone 830 to facilitate voice-enabled functions, such as speaker recognition, voice replication, digital recording, and telephony functions. The audio subsystem 826 can be configured to facilitate processing voice commands, voiceprinting and voice authentication, for example.

The I/O subsystem 840 can include a touch-surface controller 842 and/or other input controller(s) 844. The touch-surface controller 842 can be coupled to a touch surface 846. The touch surface 846 and touch-surface controller 842 can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch surface 846.

The other input controller(s) 844 can be coupled to other input/control devices 848, such as one or more buttons, rocker switches, thumb-wheel, infrared port, USB port, and/or a pointer device such as a stylus. The one or more buttons (not shown) can include an up/down button for volume control of the speaker 828 and/or the microphone 830.

In one implementation, a pressing of the button for a first duration can disengage a lock of the touch surface 846; and a pressing of the button for a second duration that is longer than the first duration can turn power to the computing device 800 on or off. Pressing the button for a third duration can activate a voice control, or voice command, module that enables the user to speak commands into the microphone 830 to cause the device to execute the spoken command. The user can customize a functionality of one or more of the buttons. The touch surface 846 can, for example, also be used to implement virtual or soft buttons and/or a keyboard.

In some implementations, the computing device 800 can present recorded audio and/or video files, such as MP3, AAC, and MPEG files. In some implementations, the computing device 800 can include the functionality of an MP3 player, such as an iPod™. The computing device 800 can, therefore, include a 36-pin connector that is compatible with the iPod. Other input/output and control devices can also be used.

The memory interface 802 can be coupled to memory 850. The memory 850 can include high-speed random access memory and/or non-volatile memory, such as one or more magnetic disk storage devices, one or more optical storage devices, and/or flash memory (e.g., NAND, NOR). The memory 850 can store an operating system 852, such as Darwin, RTXC, LINUX. UNIX. OS X. WINDOWS, or an embedded operating system such as VxWorks.

The operating system 852 can include instructions for handling basic system services and for performing hardware dependent tasks. In some implementations, the operating system 852 can be a kernel (e.g., UNIX kernel). In some implementations, the operating system 852 can include instructions for performing voice authentication. For example, operating system 852 can implement the offline map data update features as described with reference to FIGS. 1-7.

The memory 850 can also store communication instructions 854 to facilitate communicating with one or more additional devices, one or more computers and/or one or more servers. The memory 850 can include graphical user interface instructions 856 to facilitate graphic user interface processing; sensor processing instructions 858 to facilitate sensor-related processing and functions; phone instructions 860 to facilitate phone-related processes and functions; electronic messaging instructions 862 to facilitate electronic-messaging related processes and functions; web browsing instructions 864 to facilitate web browsing-related processes and functions; media processing instructions 866 to facilitate media processing-related processes and functions; GNSS/Navigation instructions 868 to facilitate GNSS and navigation-related processes and instructions; and/or camera instructions 870 to facilitate camera-related processes and functions.

The memory 850 can store other software instructions 872 to facilitate other processes and functions, such as the offline map data update processes and functions as described with reference to FIGS. 1-7.

The memory 850 can also store other software instructions 874, such as web video instructions to facilitate web video-related processes and functions; and/or web shopping instructions to facilitate web shopping-related processes and functions. In some implementations, the media processing instructions 866 are divided into audio processing instructions and video processing instructions to facilitate audio processing-related processes and functions and video processing-related processes and functions, respectively.

Each of the above identified instructions and applications can correspond to a set of instructions for performing one or more functions described above. These instructions need not be implemented as separate software programs, procedures, or modules. The memory 850 can include additional instructions or fewer instructions. Furthermore, various functions of the computing device 800 can be implemented in hardware and/or in software, including in one or more signal processing and/or application specific integrated circuits.

What is claimed is:

1. A method implemented by a client computing device, the method comprising:

storing, by the client computing device, a plurality of map objects comprising a first set of map objects of a first category and a second set of maps objects of a second category;

determining resource levels of one or more resources of the client computing device;

based on the determined resource levels:
  determining that the client computing device can download available updates for the first set of map objects of the first category;
  determining that the client computing device will not download available updates for the second set of map object of the second category;
  based on determining that the client computing device can download the available updates for the first set of map objects of the first category and will not download the available updates for the second set of map objects:
    selecting, for downloading, the available updates for the first set of map objects of the first category; and
    requesting, by the client computing device, the available updates for the first set of map objects of the first category;

subsequent to requesting the available updates for the first set of map objects of the first category: receiving the available updates for the first set of map objects to obtain a first updated set of map objects without receiving the available updates for the second set of map objects; and presenting hybrid map data comprising (a) old map data comprising the second set of map objects that do not incorporate the available updates for the second set of map objects, and (b) new map data comprising the first updated set of map objects.

2. The method of claim 1, wherein the first category and the second category are included in a plurality of categories of map objects, wherein the plurality of categories of map objects includes a points of interest category, a routing data category, a road network category, and a map image category.

3. The method of claim 1, further comprising:
  determining that updates are available for the first set of map objects and the second set of map objects at least by:
    sending, by the client computing device, a set of map object identifiers that represent the plurality of map objects stored at the client computing device; and
    receiving map object identifiers for map objects having available updates, the map object identifiers identifying the first set of map objects and the second set of map objects.

4. The method of claim 1, further comprising, subsequent to presenting the hybrid map data:
  determining that the client computing device can download the available updates for the second set of maps objects of the second category;
  requesting the available updates for the second set of map objects of the second category;
  receiving the available updates for the second set of map objects of the second category to obtain a second updated set of map objects; and
  presenting updated map data comprising (a) the first updated set of map objects, and (b) the second updated set of map objects.

5. The method of claim 1,
  wherein presenting the hybrid map data comprises: generating a first presentation of a first map region, the first presentation including a first map object and a map object, wherein the first map object is included in the first updated set of map objects, and the second map object is retrieved by the client computing device from a storage device of the client computing device.

6. The method of claim 1, further comprising, subsequent to presenting the hybrid map data:
determining that the client computing device is connected to a Wi-Fi network; and
in response to the determination, downloading the available updates for the second set of map objects of the second category.

7. The method of claim 1, further comprising, subsequent to presenting the hybrid map data:
determining that the client computing device is connected to an external power source; and
in response to the determination, downloading the available updates for the second set of map objects of the second category.

8. The method of claim 1, further comprising receiving map object identifiers for map objects having available updates, the map object identifiers identifying the first set of map objects and the second set of map objects.

9. A system configured to generate and distribute map data updates, the system comprising:
at least one processor; and
at least one non-transitory memory configured to store map data and instructions that, when executed by the at least one processor, cause the at least one processor to perform processing comprising:
storing, by the client computing device, a plurality of map objects comprising a first set of map objects of a first category and a second set of maps objects of a second category;
determining resource levels of one or more resources of the client computing device;
based on the determined resource levels:
determining that the client computing device can download available updates for the first set of map objects of the first category;
determining that the client computing device will not download available updates for the second set of map object of the second category;
based on determining that the client computing device can download the available updates for the first set of map objects of the first category and will not download the available updates for the second set of map objects:
selecting, for downloading, the available updates for the first set of map objects of the first category; and
requesting, by the client computing device, the available updates for the first set of map objects of the first category;
subsequent to requesting the available updates for the first set of map objects of the first category: receiving the available updates for the first set of map objects to obtain a first updated set of map objects without receiving the available updates for the second set of map objects; and
presenting hybrid map data comprising (a) old map data comprising the second set of map objects that do not incorporate the available updates for the second set of map objects, and (b) new map data comprising the first updated set of map objects.

10. The system of claim 9, wherein the first category and the second category are included in a plurality of categories of map objects, wherein the plurality of categories of map objects includes a points of interest category, a routing data category, a road network category, and a map image category.

11. The system of claim 9, wherein the instructions further cause the at least one processor to perform processing comprising:
determining that updates are available for the first set of map objects and the second set of map objects at least by:
sending, by the client computing device, a set of map object identifiers that represent the plurality of map objects stored at the client computing device; and
receiving map object identifiers for map objects having available updates, the map object identifiers identifying the first set of map objects and the second set of map objects.

12. The system of claim 9, wherein the instructions further cause the at least one processor to perform processing comprising, subsequent to presenting the hybrid map data:
determining that the client computing device can download the available updates for the second set of maps objects of the second category;
requesting the available updates for the second set of map objects of the second category;
receiving the available updates for the second set of map objects of the second category to obtain a second updated set of map objects; and
presenting updated map data comprising (a) the first updated set of map objects, and (b) the second updated set of map objects.

13. The system of claim 9,
wherein presenting the hybrid map data comprises: generating a first presentation of a first map region, the first presentation including a first map object and a second map object, wherein the first map object is included in the first updated set of map objects, and the second map object is retrieved by the client computing device from a storage device database of the client computing device.

14. The system of claim 9, wherein the instructions further cause the at least one processor to perform processing comprising, subsequent to presenting the hybrid map data:
determining that the client computing device is connected to a Wi-Fi network; and
in response to the determination, downloading the available updates for the second set of map objects of the second category.

15. A client computing device configured to operate a map application, the client computing device comprising:
at least one processor; and
at least one non-transitory memory configured to store map data and instructions that, when executed by the at least one processor, cause the at least one processor to perform processing comprising:
storing, by the client computing device, a plurality of map objects comprising a first set of map objects of a first category and a second set of maps objects of a second category;
determining resource levels of one or more resources of the client computing device;
based on the determined resource levels:
determining that the client computing device can download available updates for the first set of map objects of the first category;

determining that the client computing device will not download available updates for the second set of map object of the second category;

based on determining that the client computing device can download the available updates for the first set of map objects of the first category and will not download the available updates for the second set of map objects:

selecting, for downloading, the available updates for the first set of map objects of the first category; and requesting, by the client computing device, the available updates for the first set of map objects of the first category;

subsequent to requesting the available updates for the first set of map objects of the first category: receiving the available updates for the first set of map objects to obtain a first updated set of map objects without receiving the available updates for the second set of map objects; and presenting hybrid map data comprising (a) old map data comprising the second set of map objects that do not incorporate the available updates for the second set of map objects, and (b) new map data comprising the first updated set of map objects.

16. The client computing device of claim 15, wherein the first category and the second category are included in a plurality of categories of map objects, wherein the plurality of categories of map objects includes a points of interest category, a routing data category, a road network category, and a map image category.

17. The client computing device of claim 15, wherein the instructions, when executed by the at least one processor, further cause the at least one processor to perform processing comprising:

determining that updates are available for the first set of map objects and the second set of map objects at least by:

sending, by the client computing device, a set of map object identifiers that represent the plurality of map objects stored at the client computing device; and receiving map object identifiers for map objects having available updates, the map object identifiers identifying the first set of map objects and the second set of map objects.

18. The client computing device of claim 15, wherein the instructions, when executed by the at least one processor, further cause the at least one processor to perform processing comprising, subsequent to presenting the hybrid map data:

determining that the client computing device can download the available updates for the second set of maps objects of the second category;

requesting the available updates for the second set of map objects of the second category;

receiving the available updates for the second set of map objects of the second category to obtain a second updated set of map objects; and presenting updated map data comprising (a) the first updated set of map objects, and (b) the second updated set of map objects.

19. The client computing device of claim 15, wherein presenting the hybrid map data comprises: generating a first presentation of a first map region, the first presentation including a first map object and a second map object, wherein the first map object is included in the first updated set of map objects, and the second map object is retrieved by the client computing device from a storage device database of the client computing device.

20. The client computing device of claim 15, wherein the instructions, when executed by the at least one processor, further cause the at least one processor to perform processing comprising, subsequent to presenting the hybrid map data:

determining that the client computing device is connected to a Wi-Fi network; and in response to the determination, downloading the available updates for the second set of map objects of the second category.

* * * * *